United States Patent [19]

Frommeld et al.

[11] Patent Number: 4,659,645

[45] Date of Patent: Apr. 21, 1987

[54] PHOTOSENSITIVE MIXTURE AND PHOTOSENSITIVE RECORDING MATERIAL WITH DIAZONIUM SALT POLYCONDENSATION PRODUCT AND FREE RADICAL RADIATION POLYMERIZABLE COMPOSITION

[75] Inventors: Hans-Dieter Frommeld, Wiesbaden; Walter Lutz, Hochheim; Hartmut Steppan, Wiesbaden, all of Fed. Rep. of Germany

[73] Assignee: Hoechst Aktiengesellschaft, Frankfurt am Main, Fed. Rep. of Germany

[21] Appl. No.: 753,132

[22] Filed: Jul. 9, 1985

[30] Foreign Application Priority Data

Jul. 10, 1984 [DE] Fed. Rep. of Germany ....... 3425328

[51] Int. Cl.$^4$ .......................... G03C 1/60; G03C 1/68; G03C 1/70
[52] U.S. Cl. .................................. 430/175; 430/156; 430/157; 430/176; 430/177; 430/179; 430/281; 430/286
[58] Field of Search ............... 430/175, 176, 156, 281, 430/286, 157, 177, 179

[56] References Cited

U.S. PATENT DOCUMENTS

| | | | |
|---|---|---|---|
| 3,679,419 | 7/1972 | Gillich | 430/175 |
| 3,867,147 | 2/1975 | Teuscher | 96/33 |
| 4,171,974 | 10/1979 | Golda et al. | 96/75 |
| 4,289,838 | 9/1981 | Rowe et al. | 430/163 |

FOREIGN PATENT DOCUMENTS

| | | | |
|---|---|---|---|
| 1153236 | 12/1980 | Canada | 430/175 |
| 0104863 | 4/1984 | European Pat. Off. | |
| 57-196230 | 12/1982 | Japan | 430/175 |
| 2044788 | 5/1983 | United Kingdom | |

OTHER PUBLICATIONS

Corcoran, C. et al., *Research Disclosure*, #16767, p. 15, 3/1978.

*Primary Examiner*—Charles L. Bowers, Jr.
*Attorney, Agent, or Firm*—Schwartz, Jeffery, Schwaab, Mack, Blumenthal & Evans

[57] ABSTRACT

A photosensitive mixture comprised of (a) a diazonium salt polycondensation product comprising recurring units of the formulas A—N$_2$X and B, which units are linked by bivalent intermediate members derived from a carbonyl compound which is capable of condensation, wherein the A—N$_2$X units are derived from aromatic diazonium compounds that are capable of condensation with formaldehyde, and the B units are derived from compounds which are free from diazonium groups and are also capable of condensation with formaldehyde in a strongly acidic medium;

(b) a compound which can be polymerized by a free-radical process;

(c) a photopolymerization initiator; and (d) a polymeric binder that is insoluble in water, but soluble in organic solvents can be used in the production of photosensitive printing plates and photoresists.

5 Claims, No Drawings

PHOTOSENSITIVE MIXTURE AND PHOTOSENSITIVE RECORDING MATERIAL WITH DIAZONIUM SALT POLYCONDENSATION PRODUCT AND FREE RADICAL RADIATION POLYMERIZABLE COMPOSITION

BACKGROUND OF THE INVENTION

The present invention relates to a negative-working photosensitive mixture which contains a diazonium salt condensation product, a polymerizable compound, a photoinitiator and a binder. The present invention further relates to a recording material that is prepared using this mixture and is preferably employed for the production of lithographic printing plates.

Combinations of photopolymerizable mixtures with negative-working diazo compounds, in particular diazonium salt polycondensation products, are disclosed in German Offenlegungsschriften No. 2,361,931 (corresponding to U.S. Pat. No. 4,289,838), No. 2,903,270 (corresponding to U.S. Pat. No. 4,171,974) and No. 3,007,212 (corresponding to British Patent Specification No. 2,044,788). In these combinations, either the diazo compound itself acts as the photoinitiator for the polymerization of the monomer, or an additional photoinitiator is used. The primary advantages offered by these combinations is said to be a better resolution of the copies, as compared with merely photopolymerizable layers, and increased print runs, as compared with layers which exclusively contain diazo compounds as the photosensitive substances. In certain cases it is also possible to perform development with aqueous solutions or even with pure water.

A similar mixture, which contains a binder with cross-linkable allyl side groups, is described in European Patent Application No. 0,104,863.

The diazonium salt polycondensation products disclosed in the above-mentioned publications are compounds prepared by condensing diphenylamine-4-diazonium salts with formaldehyde, optionally followed by a modification of the diazonium salt anion.

These known combinations, some of which contain water-soluble polymers, are often sensitive to unfavorable climatic changes, such as increased temperatures or relative humidity, which in most cases leads to reduced shelf lives. Moreover, the adhesion to a support of layers comprising the known combinations frequently is not optimal, in particular in the exposed state.

U.S. Pat. No. 3,867,147 discloses diazonium salt polycondensation products, which in addition to diazonium salt units contain other units which are free from diazonium groups and are linked with each other and with the diazonium salt units by bivalent linking members derived from active carbonyl compounds, in particular methylene groups. These polycondensation products can be combined with binders to provide printing plates displaying a higher sensitivity to light and lower sensitivity to humidity than the formaldehyde condensation products mentioned above.

SUMMARY OF THE INVENTION

It is an object of the present invention to provide a negative-working, photosensitive mixture that can be used to produce a photosensitive layer which is distinguished by good resolution, increased photosensitivity, and excellent layer-to-support adhesion.

It is also an object of the present invention to provide recording material that is characterized by improved storability in the unexposed state and that is useful in producing, inter alia, lithographic printing plates displaying long print runs.

In accomplishing the foregoing objects, there has been provided, in accordance with one aspect of the present invention, a photosensitive mixture comprising (a) a diazonium salt polycondensation product; (b) a compound that is polymerizable by a free-radical process, comprising at least two terminal ethylenically unsaturated groups and having a boiling point, at normal pressure, above 100° C.; (c) a polymerization initiator that by the action of actinic radiation forms free radicals; and (d) a polymeric binding that is insoluble in water, but soluble in organic solvents, wherein the diazonium salt polycondensation product is comprised of first recurring units and second recurring units that are linked by bivalent intermediate members derived from a carbonyl compound which is capable of condensation. The first recurring units are derived from compounds represented by the formula $(R^1—R^3—)_pR^2N_2X$, in which X denotes an anion of a diazonium compound, p denotes an integer from 1 to 3, $R^1$ denotes a carbocyclic or heterocyclic aromatic group having at least one position capable of condensation, $R^2$ denotes an arylene group of the benzene or naphthalene series, $R^3$ denotes a single bond or one of the following groups:

$—(CH_2)_q—NR^4—$, $—O—(CH_2)_r—NR^4—$, $—S—(CH_2)_r—NR^4—$, $—S—CH_2—CO—NR^4—$, $—O—R^5—O—$, $—O—$, $—S—$ and $—CO—NR^4—$, q denotes an integer from 0 to 5, r denotes an integer from 2 to 5, $R^3$ denotes a hydrogen atom, an alkyl group having 1 to 5 carbon atoms, an aralkyl group having 7 to 12 carbon atoms or an aryl group having 6 to 12 carbon atoms, and $R^5$ denotes an arylene group having 6 to 12 carbon atoms.

The second recurring units are diazonium group-free radicals of an aromatic amine, a phenol, a thiophenol, a phenol ether, an aromatic thioether, an aromatic hydrocarbon, an aromatic heterocyclic compound or an organic acid amide.

In accordance with another aspect of the present invention, there has been provided a photosensitive recording material which is particularly suitable for the production of lithographic printing plates and which comprises a layer support and a photosensitive layer applied thereto, the photosensitive layer being comprised of the above-described mixture.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The diazonium salt polycondensation products contained in the mixture according to the present invention are described in detail in U.S. Pat. No. 3,867,147, the contents of which are incorporated by reference. Of the classes of compounds disclosed by the aforesaid patent, condensation products of diphenylamine-4-diazonium salts which are optionally substituted by alkyl or alkoxy groups or by halogen atoms are preferred constituents of the present invention. As the second component B, the optionally substituted diphenyl ethers, diphenyl sulfides, diphenyl methanes or diphenyls are preferred. Bismethoxymethyl derivatives, bis-hydroxy-methyl derivatives and bis-acetoxymethyl derivatives of the basic compounds are particularly preferably employed for the condensation reaction. Condensation product (a), comprising first recurring units (represented by the formula "A—$N_2X$") and second recurring units (denoted "B" units) preferably contain an average number of 0.1 to 50, preferably of 0.2 to 20, B units per A—$N_2X$ unit.

The quantity of diazonium salt polycondensation product contained in the mixture in general varies between 5 and 60% by weight, preferably between 10 and 30% by weight, relative to the total content of non-volatile constituents.

Other, particularly advantageous polycondensation products are obtained by condensing an optionally substituted diphenylamine diazonium salt first with an aromatic compound of the formula R'—O—$CH_2$—B, and then with an aromatic compound of the formula R'—O—$CH_2$—B—$CH_2$—O—R', where R' denotes a hydrogen atom, an alkyl group or an aliphatic acyl group. These condensation products are described in the U.S. patent application Ser. No. 593,091, filed on Mar. 26, 1984, now abandoned, the contents of which are incorporated herein by reference.

Compounds which can be polymerized by a free-radical process preferably are acrylic or methacrylic acid esters of polyhydric, in particular primary, alcohols. The alcohols can contain 2 to 6, preferably 2 to 4, OH groups. Minor amounts of (meth)acrylic esters of monohydric alcohols can also be contained in the mixture. Examples of suitable esters include trimethylolpropane triacrylate, pentaerythritol triacrylate and pentaerythritol tetraacrylate, dipentaerythritol hexamethyacrylate, propylene glycol dimethylacrylate, glycerol dimethacrylate, triethylene glycol dimethacrylate, polyethylene glycol diacrylate and bisacrylates of oxyethylated bisphenol-A derivatives. Also suitable are the low molecular weight, urethane group-containing acrylates and methacrylates obtained by reacting hydroxyalkyl acrylate or methacrylate with bivalent or polyvalent isocyanates. The polyisocyanates can, in turn, be prepared by reacting diisocyanates with diols or triols so that oligomeric compounds are obtained. The quantity of the polymerizable compounds in general varies between about 10 and 65% by weight, preferably between about 20 and 56% by weight.

A great number of compounds can be used as photoinitiators; these can also be mixtures of two or more different compounds that together often have a synergistic effect. Examples of suitable compounds are benzoin and its derivatives; polynuclear quinones; acridine derivatives, such as 9-phenyl-acridine, 9-p-methoxyphenyl-acridine, benz(a)acridine; phenazine derivatives, such as 9,10-dimethyl-benz(a)phenazine, 10-methoxybenz(a)phenazine; quinoxaline derivatives, such as 6,4',4"-trimethoxy-2,3-diphenyl quinoxaline, 4',4"-dimethoxy-2,3-diphenyl-5-azaquinoxaline; bistrichloromethyl-s-triazines having an aromatic substituent or carbonyl-methylene heterocyclic compounds having a trichloromethyl substituent, such as 2-(p-trichloromethyl-benzoylmethylene)-3-ethylbenzothiazoline. Special preference is given to the trichloromethyl compounds. The quantity of the photoinitiator in general varies between about 0.05 and 10% by weight, preferably between about 0.1 and 5% by weight.

Water-insoluble polymers, such as polyacrylates, polymethacrylates, polyvinyl esters and polyvinyl acetals, epoxy resins, polyurethanes, polysulfonyl urethanes and polyvinyl phenols are predominantly used as binders in the present invention. It is also possible to use copolymers of crotonic acid, maleic acid anhydride, acrylic or methacrylic acid and alkyl acrylates, alkyl methacrylates, acrylonitrile, styrene, vinyl acetate and similar monomers.

The mixtures according to the present invention may furthermore contain acids, inhibitors of thermal polymerization, dyestuffs, pigments, leveling agents, plasticizers, surfactants and other customary additives.

The mixtures of the present invention are preferably used in the production of photosensitive printing plates, in particular lithographic printing plates. The preferred layer supports for such plates are metals, for example, zinc, steel, chromed steel, brass/chromium, copper/aluminum and aluminum. For the production of lithographic printing plates, aluminum is preferably employed, in particular mechanically, chemically or electrolytically roughened aluminum which also preferably is provided with an oxide layer produced by an anodic process.

The mixtures are also useful for photoresist applications, for example, for the production of gravure, letterpress and multi-metal printing plates; and for the production of printed circuits. In this field of application, the present invention offers the particular advantage that very frequently a higher resolution can be achieved than with the conventionally employed photopolymerizable mixtures. In all fields of application, the mixtures according to the present invention provide the advantages, relative to the known mixtures based on a photopolymer/diazonium salt condensation product, of increased sensitivity to light, enhanced storability and improved adhesion of the photosensitive layer, in particular in the exposed state.

Depending on the respective layer constituents, the following substances are examples of suitable solvents for preparing the coating solutions: alcohols, such as methanol and ethanol; glycol ethers, such as propylene glycol monomethyl ether; dimethyl formamide and diethyl formamide; ethers, such as dioxan and tetrahydrofuran; esters, such as ethyl acetate, butyl acetate, propylene glycol methyl ether acetate; ketones, such as methyl ethyl ketone and cyclohexanone.

The photosensitive layer is produced in a customary manner by applying a solution of its constituents to the layer support. The photosensitive layer can also be first applied to a temporary support, from which it can be stripped off again by mechanical means and transferred, by laminating, to the final support, for example, a nickel foil or the copper layer of a base material for printed circuit boards.

During processing, the copying material is imagewise exposed through an original. Any light source conventionally used in the copying art that emits radiation in the long-wave ultraviolet range, such as carbon arc lamps, mercury high-pressure lamps and pulsed xenon lamps, can be employed for the imagewise exposure. Electron and laser irradiation can also be used for recording images.

After exposure, developing is carried out using a suitable developer. As developers, aqueous solutions comprising surfactants, which solutions optionally contain an alkali admixture, and mixtures thereof with organic solvents, aqueous salt solutions and aqueous acid solutions, e.g., solutions of phosphoric acids, which, in turn, can contain salts or organic solvents; or aqueous-alkaline developers, e.g, aqueous solutions of sodium salts of phosphoric acid or silicic acid, can be employed. Organic solvents also can be added to the aqueous-alkaline developers. In some cases it is also possible to use organic solvents which have been diluted with water. Further constituents, such as surfactants and hydrophilizing agents, may also be used in the aqueous-alkaline developers.

Development is performed in a known manner, for example, by immersion into and/or wiping or spraying with developer liquid. The unexposed layer areas are thereby removed.

The following examples illustrate the production, according to the present invention, of photosensitive mixtures and recording materials prepared therewith. In the examples, parts by weight (p.b.w.) and parts by volume (p.b.v.) are related to each other as grams and milliliters. Temperatures are indicated in °C. and percentages are expressed in terms of weight.

EXAMPLE 1

Three photosensitive solutions are prepared by dissolving the following components in the stock solution described below:
(a) 7.0 p.b.w. of the polycondensation product obtained from 1 mole of diphenylamine-4-diazonium sulfate and 1 mole of formaldehyde, precipitated as the 2-hydroxy-4-methoxybenzophenone-5-sulfonate (13.6 mmoles, relative to benzene diazonium units);
(b) 7.0 p.b.w. of the polycondensation product obtained from 1 mole of 3-methoxy-diphenylamine-4-diazoniumsulfate and 1 mole of 4,4'-bis-methoxymethyldiphenyl ether, precipitated as the 2-hydroxy-4-methoxybenzophenone-5-sulfonate (9.6 mmoles);
(c) 9.9 p.b.w. of the polycondensation product described under (b) (13.6 mmoles).

Stock solution 100 p.b.w. of dimethyl formamide,
150 p.b.w. of tetrahydrofuran,
100 p.b.w. of methanol,
120 p.b.w. of a 1% strength solution of 2-(4-ethoxy-naphth-1-yl)-4,6-bis-trichloromethyl-s-triazine in 2-methoxy ethanol,
40 p.b.w. of a 25% strength solution of dipentaerythritol hexacrylate in methylethyl ketone,
15 p.b.w. of a copolymer comprising 95% of vinyl acetate and 5% of crotonic acid,
50 p.b.w. of a 1% strength solution of phosphoric acid in 2-methoxy ethanol, and
0.7 p.b.w. of Viktoria Pure Blue FGA (C.I. 42595).

Each of these three solutions was coated onto an aluminum foil which had been roughened by means of wire brushes, and was then dried for 2 minutes at temperatures up to 110° C. (resulting layer weight about 1.2 g/m$^2$). In a vacuum copying frame, samples (a), (b) and (c) were exposed for 60 seconds under a screened original, respectively, by means of a 5 kW metal halide lamp, and were then developed within 30 seconds with a solution comprising 15 p.b.w. of pelargonic acid,
10 p.b.w. of sodium hydroxide,
92 p.b.w. of a block polymer comprising 90% of propylene oxide and 10% of ethylene oxide, and
12 p.b.w. of sodium tetrapolyphosphate, in
550 p.b.w. of water.

Sample (a) showed a heavily attacked image, to the extent that the screen areas could be destroyed by rubbing with a finger. Samples (b) and (c), which had been prepared according to the present invention, showed crisp images exhibiting good adhesion to the support.

In order to compensate for the reduced photosensitivity of soluton (a), sample (a) was also exposed for 120 seconds and 180 seconds, prior to being developed as described above. But in contrast to samples (b) and (c), prepared according to the invention, the screen dots of sample (a) showed insufficient adhesion even after the prolonged exposure time, i.e., an unusable printing form was obtained.

Solutions (a), (b) and (c) were also spin-coated onto electrochemically roughened and anodically oxidized aluminum foil (layer weight 1.5 g/cm$^2$). The samples were exposed under a continuous tone step wedge having a range of density of between 0.05 and 3.05, the density increments being 0.15. When sample (a) was exposed for 120 seconds, sample (b) for 60 seconds and sample (c) for 52 seconds, step wedges of identical lengths were obtained when development was performed as described above. This means that samples (b) and (c) according to the present invention were considerably more photosensitive.

When unexposed samples (a) to (c), on electrochemically roughened and anodically oxidized aluminum foil, were stored at 100° C., i.e., under extreme conditions, for 0.5, 1, 2, 3 and 4 hours, sample (a) could no longer be developed without scumming after 2 hours. Samples (b) and (c), prepared according to the present invention, were still usable after 2 hours and after 3 hours, and it was only after 4 hours' storage at 100° C. that they could not be developed without scumming.

EXAMPLE 2

The procedure of Example 1 was modified as follows:
instead of 2-(4-ethoxy-naphth-1-yl)-4,6-bis-trichloromethyl-s-triazine, 1.2 g of 2-(4-trichloromethyl-benzoylmethylene)-3-ethyl-benzothiazoline were used as the photoinitiator;
instead of dipentaerythritol hexaacrylate, an equal amount of a reaction product of 2 moles of 2,2,4-trimethyl-hexamethylene diisocyanate, 1 mole of triethylene glycol and 2 moles of hydroxyethyl methacrylate was used; and
a copolymer comprising 90% of vinyl acetate and 10% of crotonic acid was used as the polymeric binder.

The printing plates according to the present invention again showed a photosensitivity which was increased by 50 to 100% over that of the comparative sample, an improved storability under forced conditions, and, in particular, a considerably improved adhesion of the layer to the support.

EXAMPLE 3

Two photosensitive solutions were prepared from the following constituents:
100 p.b.w. of dimethyl formamide,
150 p.b.w. of tetrahydrofuran,
100 p.b.w. of methanol,
170 p.b.w. of 2-methoxyethanol,
30 p.b.w. of methyl-ethyl ketone,
10 p.b.w. of pentaerythritol-tetraacrylate/-triacrylate (technical-grade mixture),
15 p.b.w. of polyvinyl acetate of a mean molecular weight of 35,000,
1.2 p.b.w. of 2-(4-styryl-phenyl)-4,6-bis-trichloromethyl-s-triazine,
0.5 p.b.w. of phosphoric acid,
0.7 p.b.w. of Viktoria Pure Blue FGA, and
(a) 7 p.b.w. of the polycondensation product from 1 mole of 3-methoxy-diphenylamine-4-diazonium sulfate and 1 mole of formaldehyde, precipitated as the mesitylene sulfonate or
(b) 7 p.b.w. of the polycondensation product from 1 mole of 3-methoxy-diphenylamine-4-diazonium sulfate and 1 mole of 4,4'-bis-methoxymethyl-diphenyl ether, precipitated as the mesitylene sulfonate.

The solutions were separately coated onto aluminum foils which had been roughened by means of wire brushes, and then were dried (resulting layer weight about 1.6 g/m²).

Due to its reduced photosensitivity, sample (a) was exposed for 120 seconds, whereas sample (b), prepared in accordance with the present invention, was exposed for 60 seconds, under a line original.

The exposed printing plates were immersed in a developer comprising
5 p.b.w. of sodium octyl sulfate,
1.5 p.b.w. of sodium metasilicate×9H$_2$O,
1.5 p.b.w. of trisodium phosphate, and
92 p.b.w. of deionized water.

In a first test, the plates were slightly wiped over with a dabber after 30 seconds, and in a second test after 120 seconds, and then were rinsed with water.

Plates (a) and (b) were completely developed after 30 seconds' action of the developer. When the developer was allowed to act for 120 seconds, the layer of plate (a) was dissolved away even in the photohardened areas, whereas plate (b), prepared in accordance with the present invention, still exhibited a satisfactory image.

When plate (a) was exposed for 60 seconds only, the adhesion of the photo-hardened layer areas to the support was reduced even further.

EXAMPLE 4

Photosensitive solutions were prepared by dissolving and mixing the following components:
14.5 mmoles of a diazonium salt polycondensate (relative to benzene diazonium salt units),
100 g of dimethyl formamide,
150 g of tetrahydrofuran,
100 g of methanol,
120 g of a 1% strength solution of 2-(4-methoxy-styryl)-4,6-bis-trichloromethyl-s-triazine,
40 g of a 25% strength solution of the monomer described in Example 3, in methyl-ethyl ketone,
15 g of a polymer of styrene and maleic acid monoallyl ester (molar ratio 1:1, molecular weight 65,000,
10 g of a 0.5% strength solution of a copolymer of dimethyl dichlorosilane and ethylene oxide in dimethyl formamide,
50 g of a 1% strength solution of phosphoric acid in 2-methoxy-ethanol, and
0.7 g of Viktoria Pure Blue FGA.

The aforesaid 14.5 mmoles of diazonium salt polycondensate comprised, respectively:
9.9 g of the polycondensation product from 1 mole of 3-methoxy-diphenylamine-4-diazonium sulfate and 1 mole of 4,4'bis-methoxymethyl-diphenyl ether, precipitated as the 2-hydroxy-4-methoxy-benzophenone-5-sulfonate (Example 4a),
7.0 g of the polycondensation product from 1 mole of diphenylamine-4-diazonium sulfate and 1 mole of formaldehyde, precipitated as the 2-hydroxy-4-methoxy-benzophenone-5-sulfonate (Example 4b),
6.9 g of the polycondensation product from 1 mole of 3-methoxy-diphenylamine-4-diazonium sulfate and 1 mole of 4,4'-bis-methoxy-methyl-diphenyl ether, precipitated as the tetrafluoroborate (Example 4c), and
4.0 g of the polycondensation product of 1 mole of diphenylamine-4-diazonium sulfate and 1 mole of formaldehyde, precipitated as the tetrafluoroborate (Example 4d).

Solutions 4a to 4d were separately applied to electrochemically roughened and anodically oxidized aluminum foils (samples a, b, c and d, respectively) and to aluminum foil that had been roughened with wire brushes (samples aa, bb, cc and dd, respectively). To determine their photosensitivity, samples (a) to (d) were exposed under a continuous tone step wedge, in such a manner that after development (developer of Example 1 for 1 minute) all step wedges had the same length.

In the following table, the exposure times required in each case for reproducing step 5 are summarized; the lower lines indicate the storability in the 100° C. test.

| Sample | a (according to the invention) | b | c (according to the invention) | d |
| --- | --- | --- | --- | --- |
| Exposure Time | 70 s | 110 s | 50 s | 70 s |
| Storability at 100° C. | 3 h | 1.5 h | 2 h | 30 min |

Samples aa, bb, cc and dd were exposed through a screened original, in accordance with the exposure times determined above, and were then developed.

To each of the samples, an adhesive tape was applied under equal pressure and was pulled off again after 1 hour. The layer portions adhering to the tape were a measure of the adhesive strengths of the individual layers.
Sample aa: 0–10% very little
Sample bb: 50–70% heavily attacked image
Sample cc: 0% no layer portions removed
Sample dd: 30–40% clearly recognizable damage With the diazonium salts used according to the present invention, layer-to-support adhesion was clearly improved.

EXAMPLE 5

A solution comprising 8.4 p.b.w. of a co-condensate of 3-methoxy-diphenylamine-4-diazonium sulfate, 4-methoxymethyl-4'-methyl-diphenylether and 1,4-bis-methoxymethyl benzene, in a molar ratio of 1:1:1, precipitated as the mesitylene sulfonate, 30 p.b.w. of polyvinyl formal (molecular weight 30,000; 7% of vinyl alcohol units, 20% to 27% of vinyl acetate units and about 50% of vinyl formal units), 28 p.b.w. of the monomer described in Example 3, 2.2 p.b.w. of 2-(4-ethoxy-naphth-1-yl)-4,6-bis-trichloromethyl-s-triazine, 0.7 p.b.w. of phosphoric acid, 2.2 p.b.w. of a copper phthalocyanine blue pigment (C.I. 74,170), 20 p.b.w. of 2-methoxy-ethyl acetate, 610 p.b.w. of methyl-ethyl ketone, and 350 p.b.w. of 2-methoxy-ethanol was applied to an electrochemically roughened, anodically oxidized aluminum foil, such that a dry layer weight of about 1.6 g/m$^2$ was obtained.

The dried printing plate was exposed through a test original and developed with a solution comprising 60 p.b.w. of propylene glycol monomethyl ether, 10 p.b.w. of glycerol, 5 p.b.w. of 2-hydroxy-ethyl acetate, 5 p.b.w. of sodium benzoate, and 20 p.b.w. of water.

The printing form prepared in this way gave 200,000 prints in an offset printing machine. When the test was stopped, no damage to the printing form was noticeable. The same good result was achieved when the diazonium salt condensate was replaced by 5 p.b.w. of a condensate of 1 mole of 3-methoxy-diphenylamine-4-diazonium sulfate and 1 mole of 4,4'-bis-methoxymethyl diphenyl ether, precipitated as the benzene sulfonate.

In both cases, the resolution was much better than with an otherwise comparable printing plate which did not contain a diazonium salt polycondensation product.

EXAMPLE 6

A solution comprising 40 p.b.w. of a terpolymer of 10 p.b.w. of styrene, 60 p.b.w. of hexylmethacrylate and 30 p.b.w. of methacrylic acid (molecular weight 35,000), 40 p.b.w. of a diurethane of 2,2,4-trimethyl hexamethylene diisocyanate and hydroxyethyl methacrylate (molar ratio 1:2), 1.6 p.b.w. of 9-phenylacridine, 650 p.b.w. of 2-methoxy-ethanol, 180 p.b.w. of methyl-ethyl ketone, and 0.24 p.b.w. of a blue azo dyestuff obtained by coupling 2,4-dinitro-6-chlorobenzene diazonium salt with 2-methoxy-5-acetylamino-N-cyanoethyl-N-hydroxyethyl aniline was divided into two portions, and was spincoated, (a) without an admixture or (b) with an admixture of 6 p.b.w. of the polycondensation product obtained from 1 mole of 3-methoxydiphenylamine-4-diazonium sulfate and 1 mole of 4,4'-bis-methoxymethyl diphenyl ether, precipitated as the mesitylene sulfonate, onto electrochemically roughened and anodically oxidized aluminum.

Four samples each of plates (a) and (b) were exposed under a continuous tone step wedge in a vacuum frame for 15, 30, 45, and 60 seconds each. Then the non-hardened areas were washed out with the developer of Example 1.

The following table indicates the number of steps which were sufficiently hardened in each case.

| Sample | Exposure seconds | | | |
|---|---|---|---|---|
| | 15 | 30 | 45 | 60 |
| a | 2 steps | 3 steps | 4 steps | 4 steps |
| b | 4 steps | 6 steps | 8 steps | 9 steps |

It can be seen that the photosensitivities of the (b) samples were considerably higher than those of the (a) samples.

Similarly good results were achieved when a polycondensation product obtained from 1 mole of 3-methoxy-diphenylamine-4-diazonium sulfate and 1 mole of 4,6-bis-methoxymethyl-1,3-xylene was employed.

EXAMPLE 7

From a solution comprising 4.5 p.b.w. of the polycondensation product of 1 mole of 3-methoxy-diphenylamine-4-diazonium sulfate and 1 mole of 4-methyl-2,6-bis-(hydroxy-methyl)anisole, precipitated as the mesitylene sulfonate, 125 p.b.w. of tetrahydrofuran, 0.09 p.b.w. of phosphoric acid, 0.3 p.b.w. of 2-(4-methoxy-styryl)-4,6-bis-trichloromethyl-s-triazine, and 0.2 p.b.w. of Viktoria Pure Blue FGA, three different batches a, b and c were prepared by adding A: a reaction product of a polyvinyl butyral (molecular weight 80,000, containing 75% of vinyl butyral units, 1% of vinyl acetate units and 20% of vinyl alcohol units) with propenylsulfonyl isocyanate having an acid number of 140, and B: pentaerythritol tetraacrylate.

The quantities of products (A) and (B) added in each case were as follows:

| | Solution a | Solution b | Solution c |
|---|---|---|---|
| A | 22.5 p.b.w. | 15 p.b.w. | 10 p.b.w. |
| B | 7.5 p.b.w. | 15 p.b.w. | 20 p.b.w. |

Solutions a, b and c were then coated onto electrochemically roughened and anodically oxidized aluminum (resulting layer weight between about 2.4 and 2.5 g/m$^2$). The printing plates thus obtained were exposed under a test original for 45 seconds.

The plates were then developed for 60 seconds with a solution of 57 p.b.w. of water, 35 p.b.w. of n-propanol, 2 p.b.w. of ethylene glycol diacetate, 1.2 p.b.w. of ammonium sulfate, 1.1 p.b.w. of diammonium hydrogen phosphate, and 3 p.b.w. of polyvinyl pyrrolidone.

All three printing forms were distinguished by an excellent resolution of the image elements and by a good ink-water balance during a print test in an offset machine.

Similarly good results were achieved when the diazonium polycondensate was replaced by a condensation product obtained from 1 mole of diphenyl-amine-4- diazonium sulfate and 1 mole of 4,4'-bis-methoxymethyl diphenyl ether, precipitated as the mesitylene sulfonate.

EXAMPLE 8

A plate of insulating material, laminated with a thin copper foil, was coated with the following solution after the copper surface had been cleaned with an abrasive agent and rinsed with acetone:

65 p.b.w. of the monomer described in Example 6,
65 p.b.w. of a terpolymer of 10 p.b.w. of styrene, 60 p.b.w. of n-hexylmethacrylate and 30 p.b.w. of methacrylic acid (molecular weight 35,000),
2 p.b.w. of 9-acryloylamino-acridine,
0.4 p.b.w. of the azo dyestuff described in Example 6,
12 p.b.w. of the polycondensation product described in Example 3b, and
380 p.b.w. of methyl-ethyl ketone.

Coating was performed such that a layer weight of about 10 g/m$^2$ was obtained. The plate was exposed through a negative original representing a circuit diagram and developed with the developer described in Example 1.

In the bared areas, the copper was etched away with a 40% strength solution of ferric chloride, so that a printed circuit was obtained.

Similarly good results were achieved when the above solution was applied to a 25 μm-thick polyethylene terephthlate film and dried, and the resulting layer was then transferred, by means of heat and pressure, to the copper surface.

What is claimed is:

1. A photosensitive mixture comprising
   (a) about 5% to 60% by weight of a photosensitive diazonium salt polycondensation product;
   (b) about 10% to 65% by weight of a compound that is polymerizable by a free-radical process, comprising at least two terminal ethylenically unsaturated groups and having a boiling point, at normal pressure, above 100° C.;
   (c) about 0.05% to 10% by weight of a polymerization initiator that by the action of actinic radiation forms free radicals; and
   (d) about 5% to 80% by weight of a polymeric binder that is insoluble in water, but soluble in organic solvents,
   wherein said diazonium salt polycondensation product is comprised of first recurring units and second recurring units that are linked by bivalent intermediate members derived from a carbonyl compound which is capable of condensation, (i) each of said first recurring units being derived from a diphenyl amine-4-diazonium salt compound which is unsubstituted or substituted by an alkyl group, an alkoxy group or a halogen atom represented by the formula $(R^1-R^3-)_q R^2-N_x X$, in which
   X denotes an anion of a diazonium compound,
   q denotes an integer from 1 to 3,
   $R^1$ denotes an arylene group of the benzene or naphthalene series,
   $R_3$ denotes a single bond or one of the following groups:

$-(CH_2)_q-NR^4-$, $-O-(CH_2)_r-NR^4-$, $-S-(CH_2)_r-NR^4-$, $-S-CH_2-CO-NR^4$, $-O-R^5-O-$, $-O-$, $-S-$ and $-CO-NR^4-$, q denoting an integer from 0 to 5,
   r denoting an integer from 2 to 5,
   $R^4$ denotes a hydrogen atom, an alkyl group having 1 to 5 carbon atoms, an aralkyl group having 7 to 12 carbon atoms or an aryl group having 6 to 12 carbon atoms, and
   $R^5$ denotes an arylene group having 6 to 12 carbon atoms;
   (ii) said second recurring units being diazonium group-free radicals of a phenol ether, an aromatic thioether or an aromatic hydrocarbon; and
   (iii) said diazonium salt polycondensation product containing an average number of 0.1 to 50 units of said second recurring units per 1 unit of said first recurring units.

2. A photosensitive mixture as claimed in claim 1, wherein said second recurring units are derived from an unsubstituted or substituted diphenyl ether, diphenyl sulfide, diphenyl methane or diphenyl.

3. A photosensitive mixture as claimed in claim 1, wherein said compound that is polymerizable by a free-radical process is an acrylic or methacrylic acid ester of a polyhydric alcohol.

4. A photosensitive mixture as claimed in claim 1, wherein said polymerization initiator is a compound possessing at least one trichloromethyl group which can be split off by a photolytic process.

5. A photosensitive recording material comprising a layer support and a photosensitive layer applied to said support, wherein said photosensitive layer is comprised of a mixture as claimed in claim 1.

* * * * *

UNITED STATES PATENT AND TRADEMARK OFFICE
CERTIFICATE OF CORRECTION

PATENT NO. : 4,659,645

DATED : April 21, 1987

INVENTOR(S) : FROMMELD et al.

It is certified that error appears in the above—identified patent and that said Letters Patent is hereby corrected as shown below:

Column 12, line 2, change "..... $-N_xX$" to -- ..... $-N_2X$ --.

Signed and Sealed this

Seventeenth Day of November, 1987

*Attest:*

DONALD J. QUIGG

*Attesting Officer*  *Commissioner of Patents and Trademarks*